(12) United States Patent
Jung et al.

(10) Patent No.: US 9,053,967 B2
(45) Date of Patent: Jun. 9, 2015

(54) APPARATUS FOR TESTING A WAFER IN A WAFER TESTING PROCESS

(71) Applicant: Samsung Electronics Co., Ltd., Suwon-si (KR)

(72) Inventors: Choong Hoon Jung, Yongin-si (KR); Jong Gu Gil, Yongin-si (KR); Woo Kyu Lee, Hwaseong-si (KR); In Seok Hwang, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 189 days.

(21) Appl. No.: 13/803,545

(22) Filed: Mar. 14, 2013

(65) Prior Publication Data

US 2014/0017041 A1 Jan. 16, 2014

(30) Foreign Application Priority Data

Jul. 11, 2012 (KR) ........................ 10-2012-0075656

(51) Int. Cl.
*G01R 31/20* (2006.01)
*H01L 21/66* (2006.01)
*G01R 31/28* (2006.01)
*H01L 21/67* (2006.01)
*H01L 21/677* (2006.01)

(52) U.S. Cl.
CPC ............ *H01L 22/10* (2013.01); *G01R 31/2891* (2013.01); *H01L 21/67103* (2013.01); *H01L 21/67742* (2013.01); *H01L 2924/0002* (2013.01)

(58) Field of Classification Search
CPC ........... G01R 31/2865; G01R 31/2886; G01R 31/2831; G01R 1/0491; G01R 31/2867; G01R 31/2875; G01R 1/0433; G01R 31/286; G01R 31/2862; G01R 31/287; G01R 31/2891; G01R 31/2877; G01R 1/07342; G01R 1/18; G01R 1/2863; G01R 31/2874; G01R 1/0408; G01R 31/2855; H01L 21/6838; H01L 21/67103; H01L 21/67248; H01L 35/00

See application file for complete search history.

(56) References Cited

U.S. PATENT DOCUMENTS

| 6,499,777 | B1* | 12/2002 | Wang ............................. 294/213 |
| 6,608,745 | B2 | 8/2003 | Tsuruta et al. |
| 7,151,386 | B2* | 12/2006 | Kim ......................... 324/754.03 |
| 7,411,773 | B2 | 8/2008 | Tatsumi et al. |
| 7,736,462 | B2 | 6/2010 | Weichart |
| 7,928,338 | B2 | 4/2011 | Suslov |
| 2003/0214310 | A1* | 11/2003 | McIntosh ...................... 324/658 |
| 2010/0103584 | A1 | 4/2010 | Nam |

FOREIGN PATENT DOCUMENTS

| JP | 2009-021311 | 1/2009 |
| JP | 2011-159684 | 8/2011 |
| KR | 10-2003-0075625 | 9/2003 |
| KR | 10-2006-0035299 | 4/2006 |
| KR | 10-2006-0076406 | 7/2006 |
| KR | 10-2006-0076580 | 7/2006 |
| KR | 10-2009-0044579 | 5/2009 |

* cited by examiner

*Primary Examiner* — Vinh Nguyen
(74) *Attorney, Agent, or Firm* — Onello & Mello, LLP

(57) ABSTRACT

An apparatus for testing a wafer includes a wafer chuck on which the wafer is loaded to perform a wafer test process. The wafer chuck is maintained at a high temperature in a predetermined temperature range. The apparatus for testing a wafer further includes a wafer handling arm supporting the wafer and transferring the wafer to the wafer chuck, and a wafer heating module coupled to the wafer handling arm, arranged parallel to the wafer, and preheating the wafer to be loaded on the wafer chuck.

14 Claims, 10 Drawing Sheets

FIG. 7
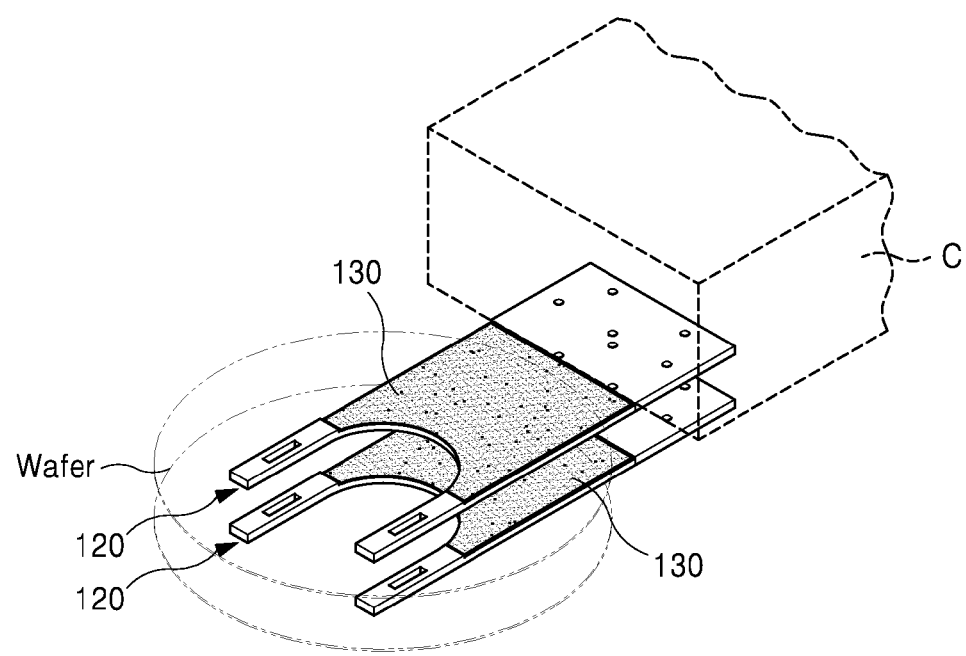
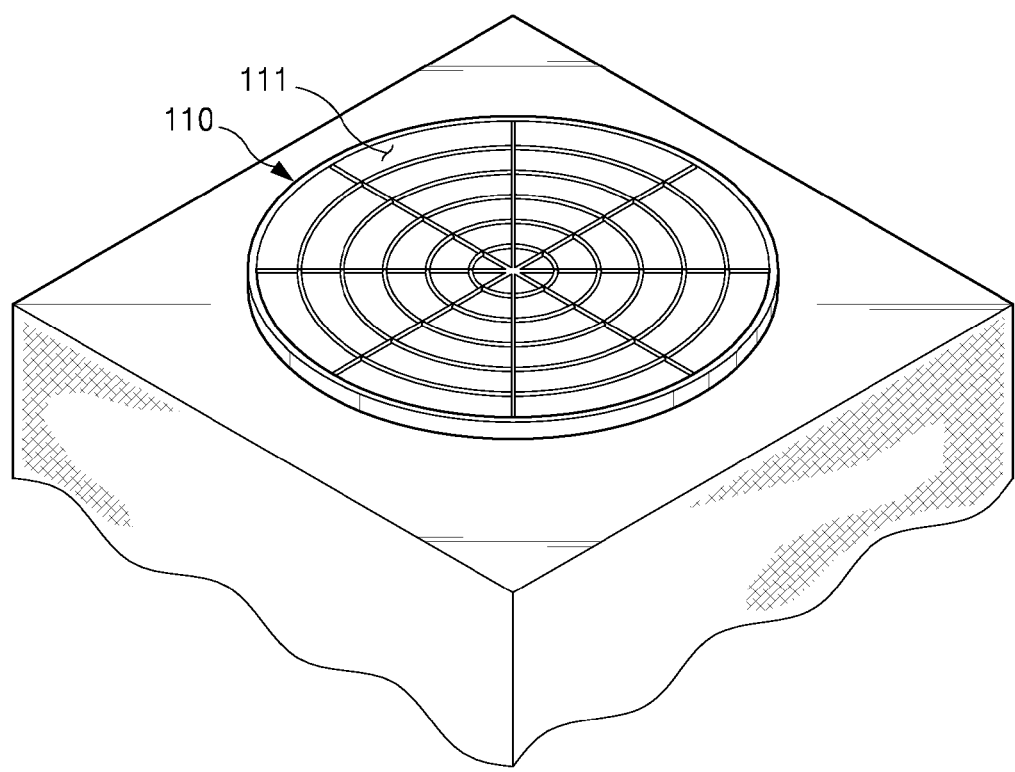

APPARATUS FOR TESTING A WAFER IN A WAFER TESTING PROCESS

CROSS-REFERENCE TO RELATED APPLICATIONS

This U.S. non-provisional application claims priority under 35 U.S.C. §119 to Korean Patent Application No. 10-2012-0075656, filed on 11 Jul. 2012, in the Korean Intellectual Property Office (KIPO), the contents of which are herein incorporated by reference in their entirety.

BACKGROUND

The inventive concepts relate to semiconductor manufacturing equipment, and more particularly, to an apparatus for testing a wafer in a wafer testing process.

A wafer testing process is one of numerous manufacturing processes performed in manufacturing a semiconductor. A wafer, which is maintained at a room temperature and is exposed to the atmosphere during a wafer testing process, is transferred by a wafer handling arm and is loaded on a wafer chuck that is maintained at a hot temperature. After the wafer is loaded on the wafer chuck, a temperature stabilization time passes and then a wafer testing process is performed.

However, while the wafer is transferred by the wafer handling arm, the temperature of the wafer is maintained at room temperature, the wafer chuck is maintained in a hot temperature state. Accordingly, temperature hunting of the wafer chuck may be generated due to a difference in temperature between the wafer which is maintained at room temperature and the wafer chuck which is maintained at a high temperature. As a result, time for stabilizing a temperature is required.

SUMMARY

The inventive concepts provide an apparatus for testing a wafer in which a wafer is preheated and loaded on to a wafer chuck for a wafer testing process so that generation of temperature hunting of the wafer chuck may be reduced and, thus, temperature stabilization in the wafer testing process may be quickly achieved.

According to an aspect of the inventive concepts, there is provided an apparatus for testing a wafer which includes a wafer chuck on which the wafer is loaded to perform a wafer testing process. The wafer chuck is maintained at a high temperature in a predetermined temperature range. The apparatus for testing a wafer may further include a wafer handling arm supporting the wafer and transferring the wafer to the wafer chuck, and a wafer heating module coupled to the wafer handling arm and arranged parallel to the wafer. The wafer heating module preheats the wafer to be loaded on the wafer chuck.

In some embodiments, the wafer handling arm may include an arm plate having an upper surface which is a heating module installation surface where the wafer heating module is installed, and a finger extending from one side of the arm plate forming a wafer support surface on which the wafer is supported.

In some embodiments, the heating module installation surface may be arranged to be lower than the wafer support surface.

In some embodiments, an upper surface of the wafer heating module installed on the heating module installation surface may be arranged to be lower than the wafer support surface.

In some embodiments, the wafer heating module may be a polyimide (PI) film heating pad having a plate shape and arranged parallel to the heating module installation surface, and the polyimide film heating pad may be coupled to and attached to the heating module installation surface.

In some embodiments, the wafer heating module may be arranged in an entire area of the heating module installation surface.

In some embodiments, a through hole for passing an electric wire that is connected to the wafer heating module may be formed in the arm plate.

In some embodiments, the finger may be comprise a pair of fingers and a cut portion having an arc shape may be formed at one side of the arm plate between the pair of fingers.

In some embodiments, the wafer handling arm may include an arm support that is connected to the arm plate at a position opposite to the finger and supports the arm plate.

In some embodiments, a plurality of coupling holes may be formed in the arm support, and the arm support may be arranged to be higher than the upper surface of the arm plate.

In some embodiments, the apparatus may further include a wafer temperature sensing unit sensing a temperature of the wafer that is supported and transferred by wafer handling arm, and a module controller controlling a wafer heating temperature of the wafer heating module based on information provided by the wafer temperature sensing unit.

In some embodiments, the apparatus may further include a chuck controller controlling a temperature of the wafer chuck, wherein the module controller controls a wafer heating temperature of the wafer heating module according to an interaction with the chuck controller.

In some embodiments, the apparatus may further include an error message display unit externally displaying error messages of the chuck controller and the module controller.

In some embodiments, the apparatus may further include a module cover coupled to the wafer handling arm and covering the wafer heating module.

In some embodiments, the wafer heating module may be exposed on an upper surface of the wafer handling arm or is buried in the wafer handling arm.

In accordance with another aspect of the inventive concepts, provided is an apparatus for testing a wafer including a wafer chuck being maintained at a first temperature, a wafer handling arm supporting the wafer and transferring the wafer to the wafer chuck, and a wafer heating module on a surface of the wafer handling arm heating the wafer to a second temperature.

In some embodiments, the first temperature is a high temperature in a predetermined temperature range.

In some embodiments, the second temperature is a temperature lower than the first temperature.

In some embodiments, the wafer handling arm includes an arm plate having an upper surface comprising a heating module installation surface where the wafer heating module is installed and a finger extending from one side of the arm plate forming a wafer support surface on which the wafer is supported.

In some embodiments, an upper surface of the wafer heating module installed on the heating module installation surface is arranged to be lower than the wafer support surface.

BRIEF DESCRIPTION OF THE DRAWINGS

The foregoing and other features and advantages of the inventive concepts will be apparent from the more particular description of embodiments of the inventive concepts, as illustrated in the accompanying drawings in which like reference characters refer to the same parts throughout the different views. The drawings are not necessarily to scale, emphasis instead being placed upon illustrating the principles of the inventive concepts.

FIG. 7 is a schematic, perspective view illustrating a structure of an apparatus for testing a wafer according to an example embodiment of the present inventive concepts.

DETAILED DESCRIPTION OF EMBODIMENTS

Figure 1:
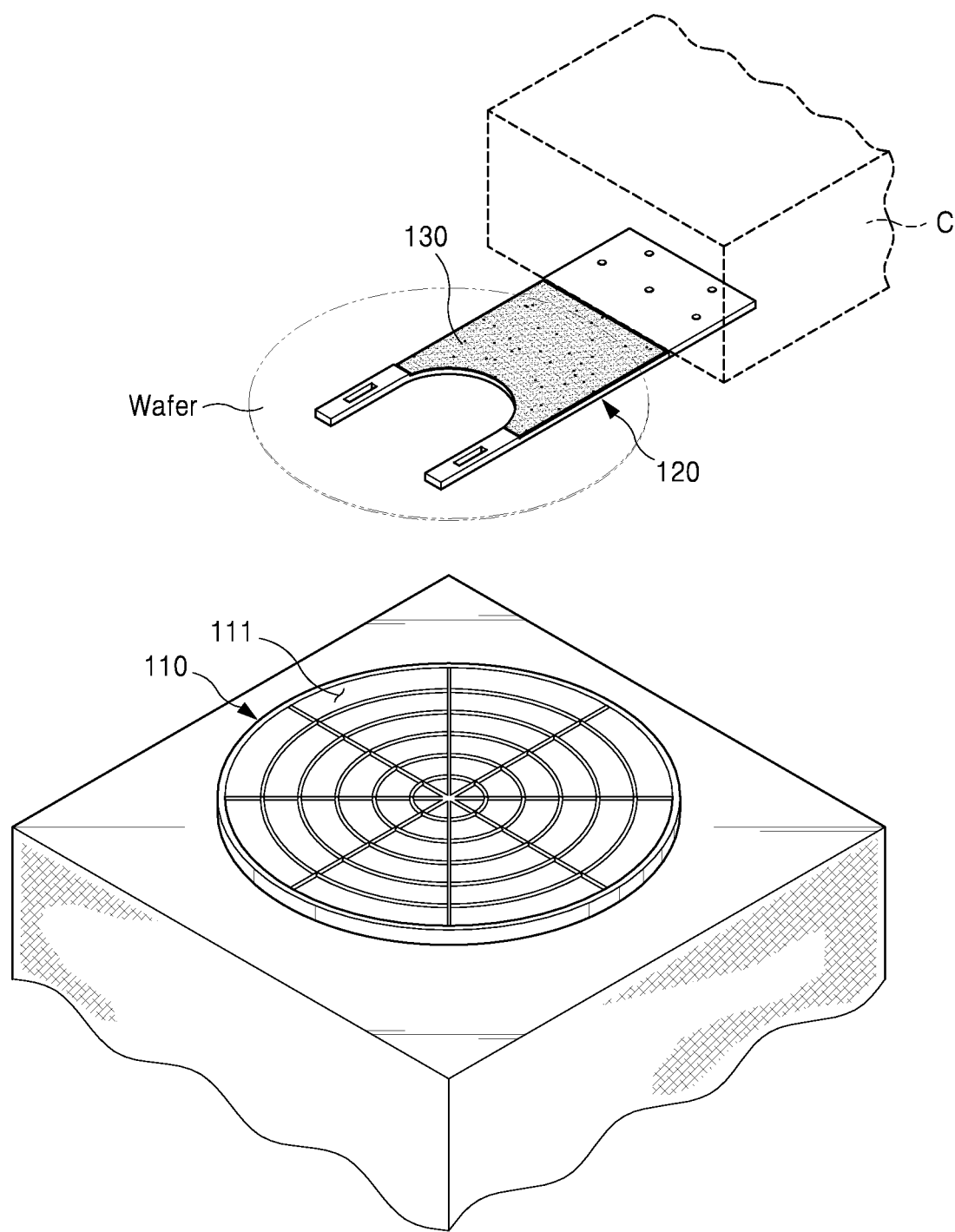
FIG. 1 is a schematic, perspective view illustrating a structure of an apparatus for testing a wafer according to an example embodiment of the present inventive concepts.

Various example embodiments of the inventive concepts will be described more fully hereinafter with reference to the accompanying drawings, in which some example embodiments are shown. The present inventive concept may, however, be embodied in many different forms and should not be construed as limited to the example embodiments set forth herein.

It will also be understood that when a layer or element is referred to as being "on," "connected to" or "coupled to" another layer or element, it can be directly on, connected or coupled to the other layer or element, or intervening layers or elements may also be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed elements.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a decide and are not intended to limit the scope of the present inventive concepts.

Figure 2:
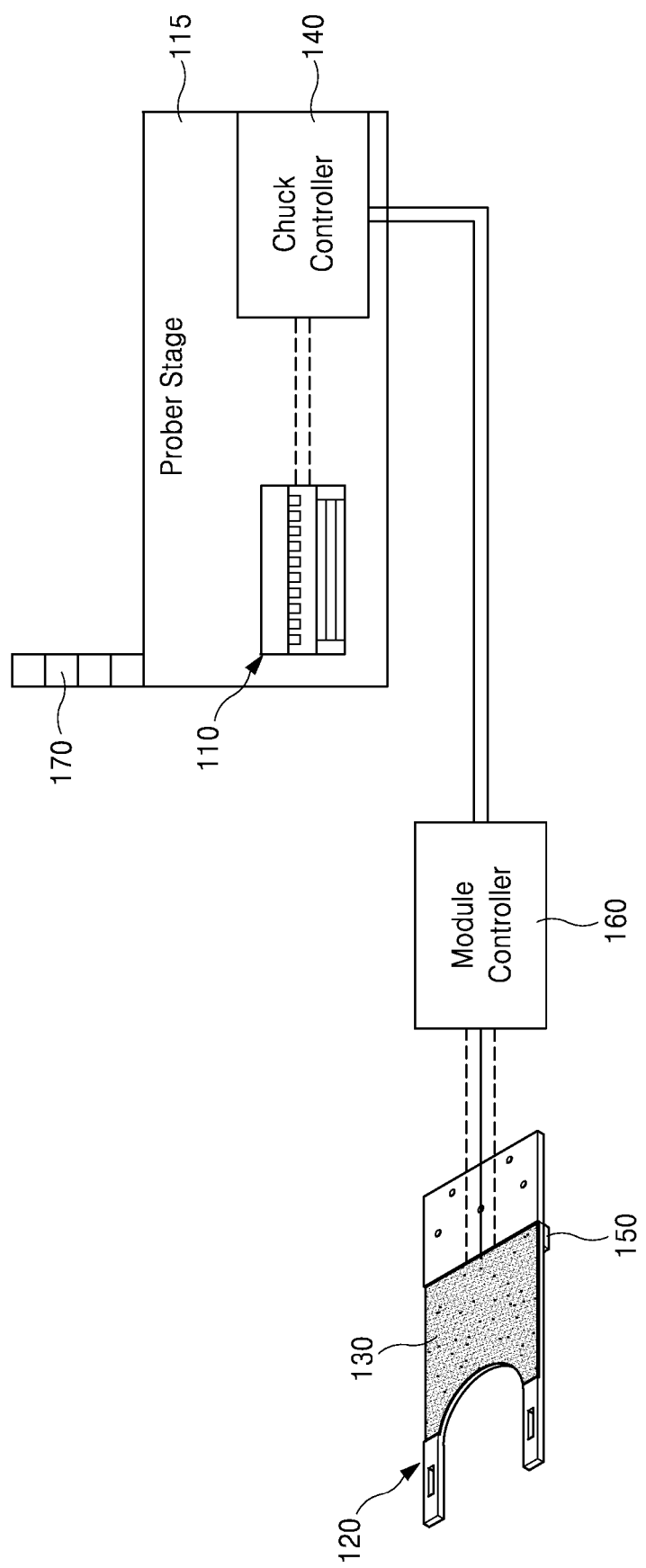
FIG. 2 is a control block diagram of the apparatus for testing a wafer of FIG. 1.
Figure 3:
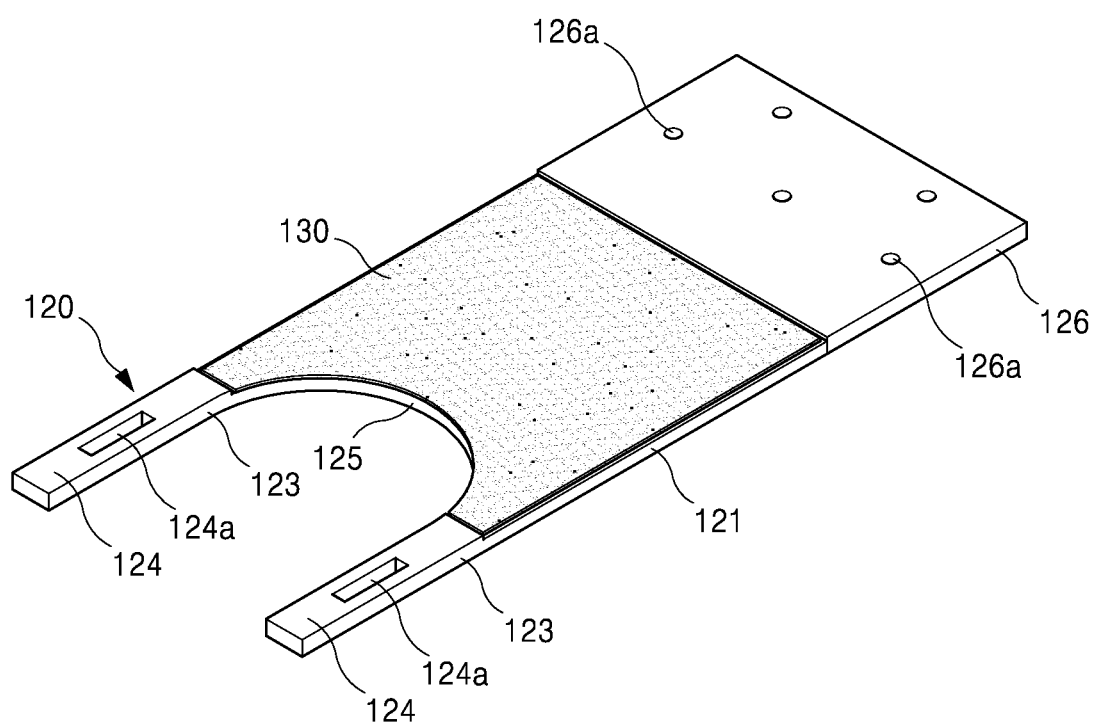
FIG. 3 is a schematic, perspective view of a wafer handling arm of the apparatus for testing a wafer of FIG. 1.
Figure 4:
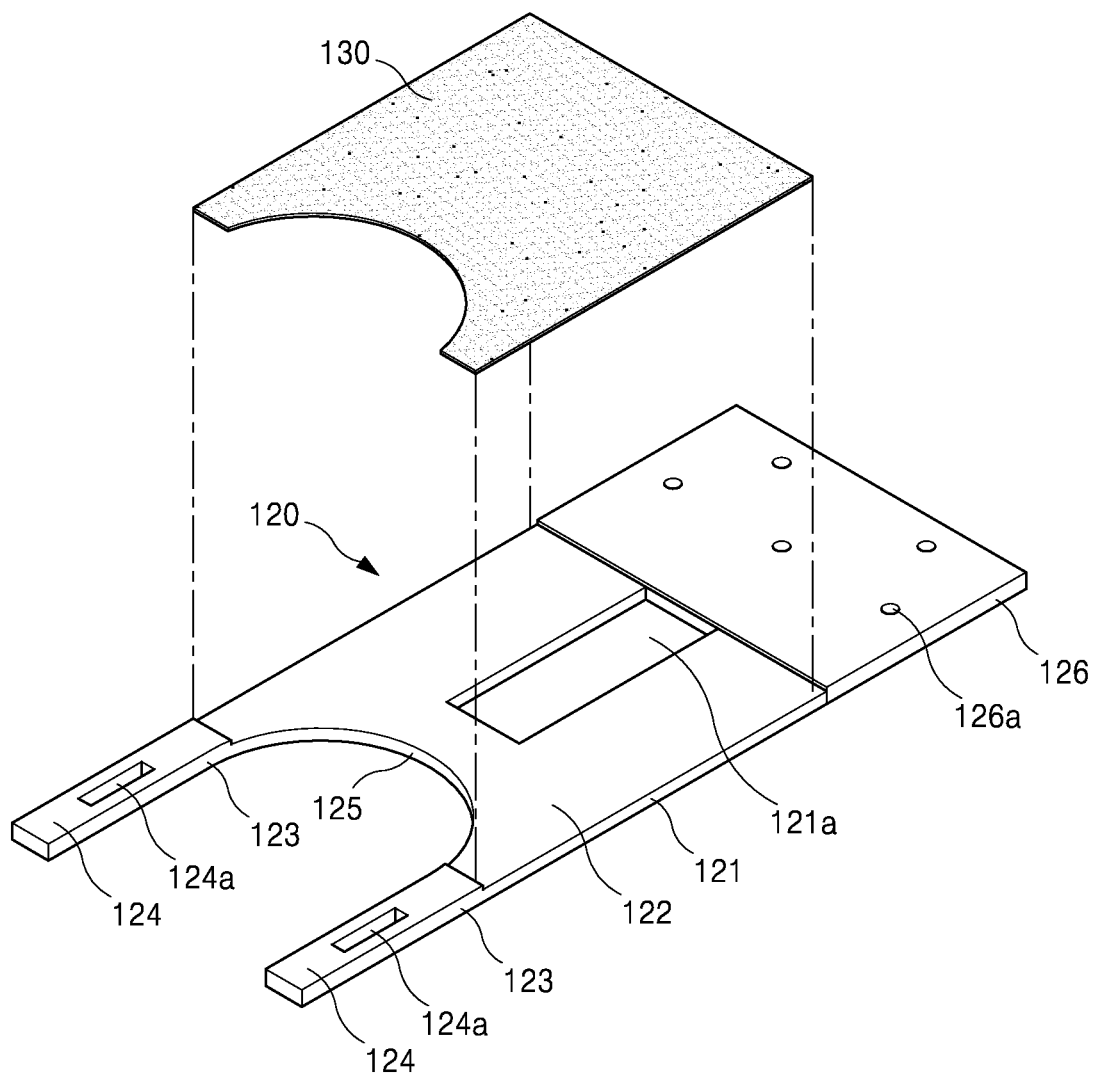
FIG. 4 is an exploded, schematic, perspective view of the wafer handling arm of the apparatus for testing a wafer of FIG. 3.
Figure 5:
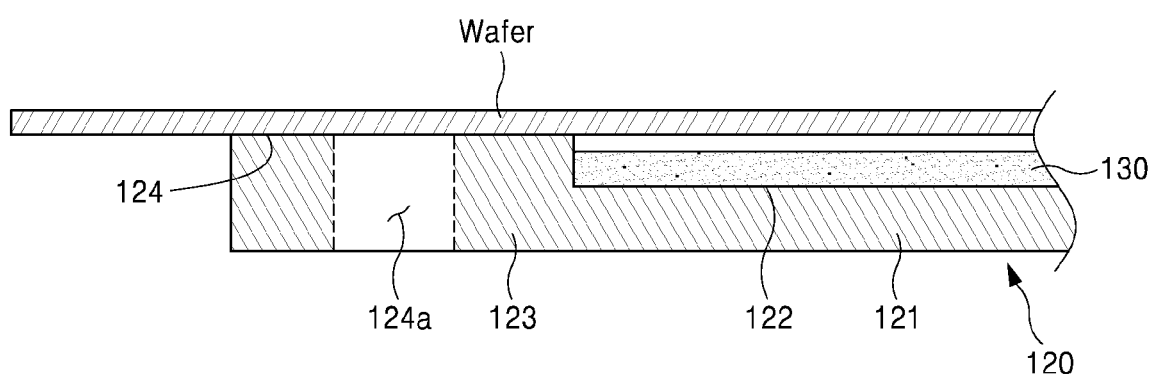
FIG. 5 is an enlarged cross-sectional view of the wafer handling arm of the apparatus for testing a wafer of FIG. 3.
Figure 6:
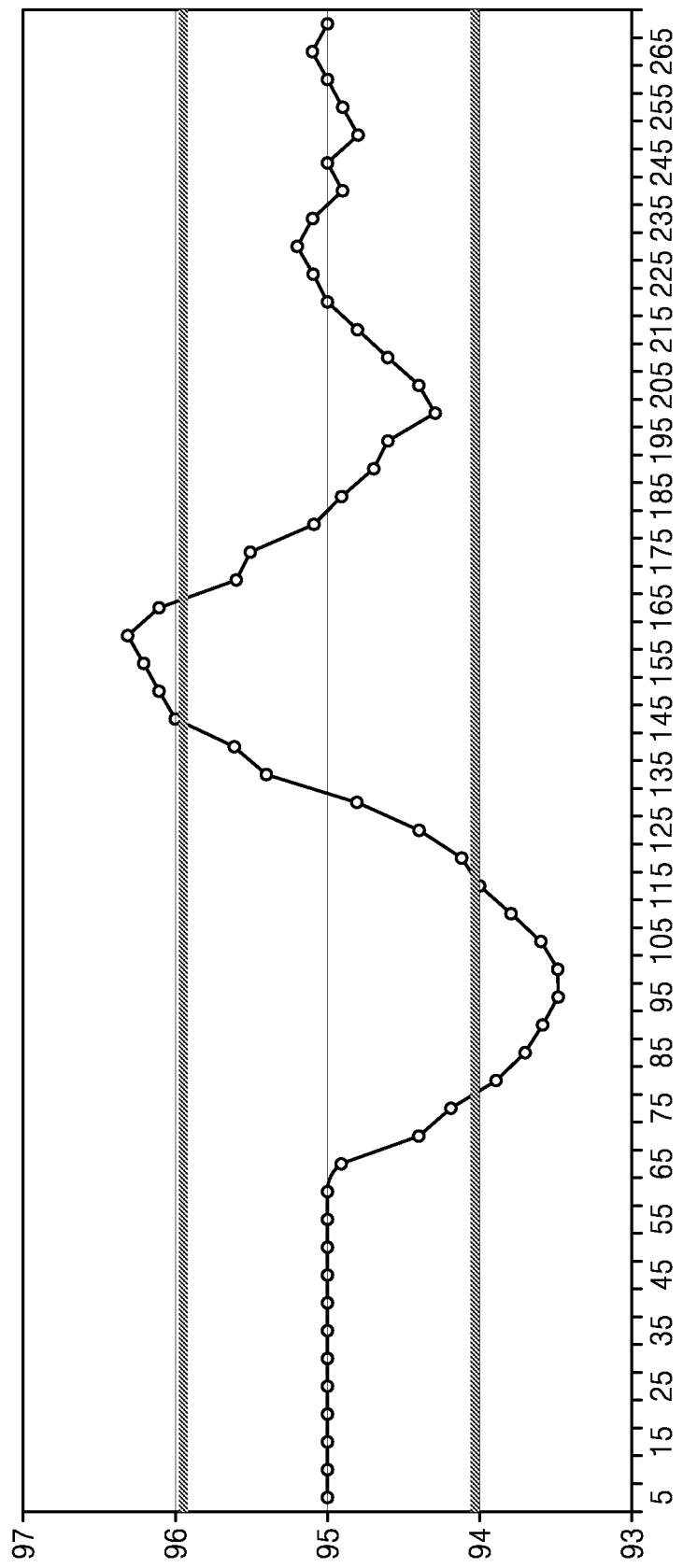
FIG. 6 is a graph illustrating a temperature hunting phenomenon generated during wafer loading at room temperature.

FIG. 1 is a schematic, perspective view illustrating a structure of an apparatus for testing a wafer according to an example embodiment of the present inventive concepts. FIG. 2 is a control block diagram of the apparatus for testing a wafer of FIG. 1. FIG. 3 is a schematic, perspective view of a wafer handling arm of the apparatus for testing a wafer of FIG. 1. FIG. 4 is an exploded, schematic, perspective view of the wafer handling arm of the apparatus for testing a wafer of FIG. 3. FIG. 5 is an enlarged, cross-sectional view of the wafer handling arm of the apparatus for testing a wafer of FIG. 3. FIG. 6 is a graph illustrating a temperature hunting phenomenon generated during wafer loading at room temperature.

Referring to FIGS. 1 and 2, an apparatus for testing a wafer according to the example embodiments is a semiconductor apparatus that may be used for testing a wafer in a wafer testing process.

The apparatus for testing a wafer according to the example embodiments includes a wafer chuck 110 on which a wafer is loaded, a wafer handling arm 120 supporting the wafer and transferring the wafer to the wafer chuck 110, and a wafer heating module 130 coupled to the wafer handling arm 120 for preheating the wafer before the wafer is loaded on to the wafer chuck 110. In the example embodiments, the wafer heating module 130 is exposed on an upper surface of the wafer handling arm 120.

The wafer chuck 110 is where a wafer to be tested is loaded. The wafer chuck 110 may be a part of a prober stage 115 as illustrated in FIG. 2.

The wafer testing process is performed after the wafer is loaded and supported on the upper surface of the wafer chuck 110. The wafer loaded on the upper surface of the wafer chuck 110 is firmly held without moving.

The wafer chuck 110 of the example embodiments may comprise a vacuum chuck which sucks the wafer to the wafer chuck 110 using vacuum pressure. To generate vacuum pressure, a plurality of vacuum holes 111 are formed in an upper portion of the wafer chuck 110. The upper surface of the wafer chuck 110 may be formed to be larger than an area of the wafer.

Since the present inventive concepts are not limited thereto, the wafer chuck 110 may comprise an electrostatic chuck ESC.

The electrostatic chuck holds a wafer to the wafer chuck 110 by using an electrostatic force. For example, when (+) electricity and (−) electricity are applied to the electrostatic chuck, the wafer is charged to the opposite electric potentials ("−" and "+") and thus a force to draw each other is generated due to the charged electric potentials, thereby preventing the wafer loaded on the wafer chuck 110 from being detached from the wafer chuck 110.

During a wafer testing process, the wafer chuck 110 is heated to a high temperature in a predetermined temperature range, for example, a temperature rang of about 85° C. to about 100° C., and the temperature of the wafer chuck 110 is maintained at the high temperature.

Referring to FIG. 2, a chuck controller 140 for controlling a temperature of the wafer chuck 110 is provided at the wafer chuck 110 to maintain the temperature of the wafer chuck at a high temperature.

Although, in the present example embodiments, the wafer chuck 110 is described as being heated to a temperature of about 85° C. to about 100° C., the heating temperature of the wafer chuck 110 may vary according to a type of the wafer testing process. Therefore, the present inventive concepts are not limited to the above temperature range.

The wafer handling arm 120 supports upwardly the wafer being transferred, as illustrated in FIG. 1, transfers the wafer toward the wafer chuck 110, and loads the wafer being transferred on to the upper surface of the wafer chuck 110. The wafer heating module 130 is coupled to the wafer handling arm 120 to be parallel to the wafer being transferred and preheats the wafer to be loaded on the wafer chuck 110.

In convention technology that does not employ the wafer heating module 130, as described above, since the wafer transferred by the wafer handling arm 120 is maintained at a room temperature and the wafer chuck 110 is maintained in at a high temperature, a temperature difference between the wafer at the room temperature and the wafer chuck 110 at a high temperature is generated. Thus, temperature hunting of the wafer chuck 110 may occur, as illustrated in FIG. 6. As a result, a time for stabilizing a temperature is delayed and productivity may be reduced.

In the present example embodiments, however, the wafer heating module 130 is provided in the wafer handling arm 120 and the wafer heating module 130 preheats the wafer to be loaded on the wafer chuck 110. Accordingly, in the present example embodiments, the temperature hunting illustrated in FIG. 6 does not occur, the time for stabilizing a temperature may be substantially reduced and, thus, productivity may be improved.

The structures of the wafer heating module 130 and the wafer handling arm 120 to which the wafer heating module 130 is coupled are described below with reference to FIGS. 3 through 5. Referring to FIGS. 3 through 5, the wafer handling arm 120 includes an arm plate 121, fingers 123, and an arm support 126.

Since an upper surface of the arm plate 121 forms a heating module installation surface 122 where the wafer heating module 130 is installed, the arm plate 121 forms the largest area in the wafer handling arm 120. When the arm plate 121 forms the largest area in the wafer handling arm 120, the wafer heating module 130 having a relatively large area may be installed and, thus, efficiency of heating a wafer may be improved. In the present example embodiments, the wafer heating module 130 is exposed on the heating module installation surface 122 of the arm plate 121.

The fingers 123 are extended from one side of the arm plate 121 and may be provided at a plurality of positions. Upper surfaces of the fingers 123 form wafer support surfaces 124 where the wafer is supported.

The heating module installation surface 122 of the arm plate 121 and the wafer support surfaces 124 of the fingers 123 may be arranged parallel to each other. In the example embodiments, the heating module installation surface 122 of the arm plate 121 is arranged to be lower than the wafer support surfaces 124 of the fingers 123.

In particular, as illustrated in FIG. 5, the wafer heating module 130 is arranged such that the upper surface of the wafer heating module 130 installed on the heating module installation surface 122 is lower than the wafer support surfaces 124. That is, a gap is formed between the wafer heating module 130 and a wafer. This gap is formed in order to prevent the wafer from directly contacting the wafer heating module 130 so that the wafer is not damaged.

In the present example embodiments, the fingers 123 may be comprise a pair of fingers. A cut portion 125 having an arc shape is formed at one side of the arm plate 121 between the fingers 123. In other example embodiments, the present inventive concepts may be applied to a case in which three or more fingers 123 are provided or the cut portion 125 is not provided and, thus, a single finger 123 is provided.

Suction holes 124a for sucking the wafer to the wafer handling arm 120 using vacuum pressure is formed in surfaces of the fingers 123, that is, the wafer support surfaces 124. The wafer may be stably sucked on to the surfaces of the fingers 123 without moving the wafer due to the vacuum pressure formed through the suction holes 124a.

The arm support 126 is connected or coupled to the arm plate 121 at the opposite side of the arm plate 121 to the fingers 123. The arm support 126 supports the arm plate 121. That is, the arm support 126 may be a part that is connected to one side of a cabinet C where the wafer handling arm 120 is installed, as illustrated in FIG. 1.

Accordingly, a plurality of coupling holes 126a may be formed in the arm support 126 for coupling the arm support 126 to the cabinet C. Although not necessary, the arm support 126 may be arranged to be higher than the heating module installation surface 122 that is the upper surface of the arm plate 121.

The wafer heating module 130 is arranged on the heating module installation surface 122 of the wafer handling arm 120 to be parallel with the heating module installation surface 122 and preheats the wafer to be loaded on the wafer chuck 110.

In the example embodiments, the wafer heating module 130 may be, for example, a polyimide (PI) film heating pad of a pad type that is arranged parallel to the heating module installation surface 122, and may be attached to the heating module installation surface 122 by using an adhesive.

The wafer heating module 130 comprising a resin material such as polyimide may be used up to about 250° C. and may exhibit superior heat-resistance. Also, the wafer heating module 130 may have less properties change from a low temperature to a high temperature, a superior anti-shock property, and a superior dimension stability. In addition, the wafer heating module 130 may have a superior electrical property, a superior anti-friction, and may be nonflammable.

The wafer heating module 130 that is, for example, a PI film heating pad may be arranged on the entire area of the heating module installation surface 122 as illustrated in FIG. 3. When the wafer heating module 130 is installed on the heating module installation surface 122 which is as large as possible, an efficiency of heating a wafer may be improved.

Since power is supplied to or cut off from the wafer heating module 130, an electric wire (not shown) is connected to the wafer heating module 130. A through hole 121a for passing the electric wire connected to the wafer heating module 130 through is formed in the arm plate 121.

Referring to FIG. 2, the apparatus for testing a wafer according to the example embodiments further includes a wafer temperature sensing unit 150 and a module controller 160. The wafer temperature sensing unit 150 is coupled to the wafer handling arm 120 and senses a temperature of the wafer being transferred on the wafer handling arm 120. The wafer temperature sensing unit 150 may be a temperature sensor and may be coupled to one side of the wafer handling arm 120.

The module controller 160 controls a wafer heating temperature of the wafer being transferred on the wafer handling arm 120 using the wafer heating module 130 based on information provided by the wafer temperature sensing unit 150.

As described above, the wafer chuck 110 is heated to and maintained at a temperature of about 85° C. to about 100° C. during the wafer testing process. Thus, the module controller 160 interacts with the chuck controller 140 to control the wafer heating module 130 so that the wafer being transferred on the wafer handling arm 120 may be maintained at a temperature lower than the temperature of the wafer chuck 110.

The module controller 160 controls the wafer heating module 130 so that the wafer may be heated while being transferred by the wafer handling arm 120 to the wafer chuck 110 for the wafer testing process. In another example embodiment, the module controller 160 controls the wafer heating module 130 so that the wafer may be heated in a standby state in which the wafer is supported by the wafer handling arm 120. The wafer may be heated by both of the methods described above. Any method may be employed in order to preheat the wafer before being loaded on the wafer chuck 110.

Certain abnormal situations may occur, for example, where the temperature control is not appropriately performed, excessive current flows in the wafer heating module 130, or a supply of current to the wafer heating module 130 is discontinued. To externally indicate such abnormal situations, an error message display unit 170 may be provided in the apparatus for testing a wafer according to the example embodiment, as illustrated in FIG. 2.

The error message display unit 170 externally displays error messages of the module controller 160 and the chuck controller 140 and may be an alarm lamp or alarm bell. When an error message is displayed, an operator halts an operation of the apparatus for testing a wafer and repair and maintenance may be performed.

In the operation of the apparatus for testing a wafer configured as above, during the wafer testing process, the wafer handling arm 120 supports upwardly a wafer that is maintained at a room temperature. The wafer may be stably sucked on the wafer support surfaces 124 by the vacuum pressure formed through the suction holes 124a formed in the surface of the fingers 123, that is, the wafer support surfaces 124.

The wafer handling arm 120 transfers the wafer and loads the wafer on the upper surface of the wafer chuck 110. While the wafer handling arm 120 transfers the wafer and loads the wafer on to the wafer chuck 110, the module controller 160 turns on the wafer heating module 130 to preheat the wafer on the wafer handling arm 120. As described above, the wafer may be continuously or intermittently heated to have a temperature lower than the temperature of the wafer chuck 110 by the wafer heating module 130 until the wafer is loaded on the wafer chuck 110. Accordingly, since the wafer is preheated while being transferred to the wafer chuck 110 by the wafer handling arm 120, separate time to heat the wafer is avoided and, thus, an unnecessary delay during the wafer testing process may be substantially prevented.

The wafer being heated to an appropriate temperature by the wafer heating module 130 is loaded on the upper surface of the wafer chuck 110 by the continuous operation of the wafer handling arm 120. Then, the wafer testing process continues after the temperature stabilization time passes.

Unlike the conventional technology, in the example embodiments of the inventive concepts, since the wafer is loaded on the wafer chuck 110 having already being heated, the temperature stabilization time may be substantially reduced compared to the conventional technology and, thus, productivity may be improved.

As such, according to the example embodiments of the inventive concepts, since the wafer may be preheated while transferring the wafer to the wafer chuck 110, generation of temperature hunting of the wafer chuck 110 may be reduced and, thus, temperature stabilization for the wafer testing process may be quickly achieved.

FIG. 7 is a schematic, perspective view illustrating a structure of an apparatus for testing a wafer according to another example embodiment of the present inventive concepts. In the above-described example embodiment of FIGS. 1-5, one wafer handling arm 120 is arranged or coupled at the cabinet C to transfer the wafer. However, two or more wafer handling arms 120 may be coupled to the cabinet C, as illustrated in FIG. 7, to transfer a plurality of wafers simultaneously. Accordingly, time for a wafer testing process may be reduced.

Figure 8:
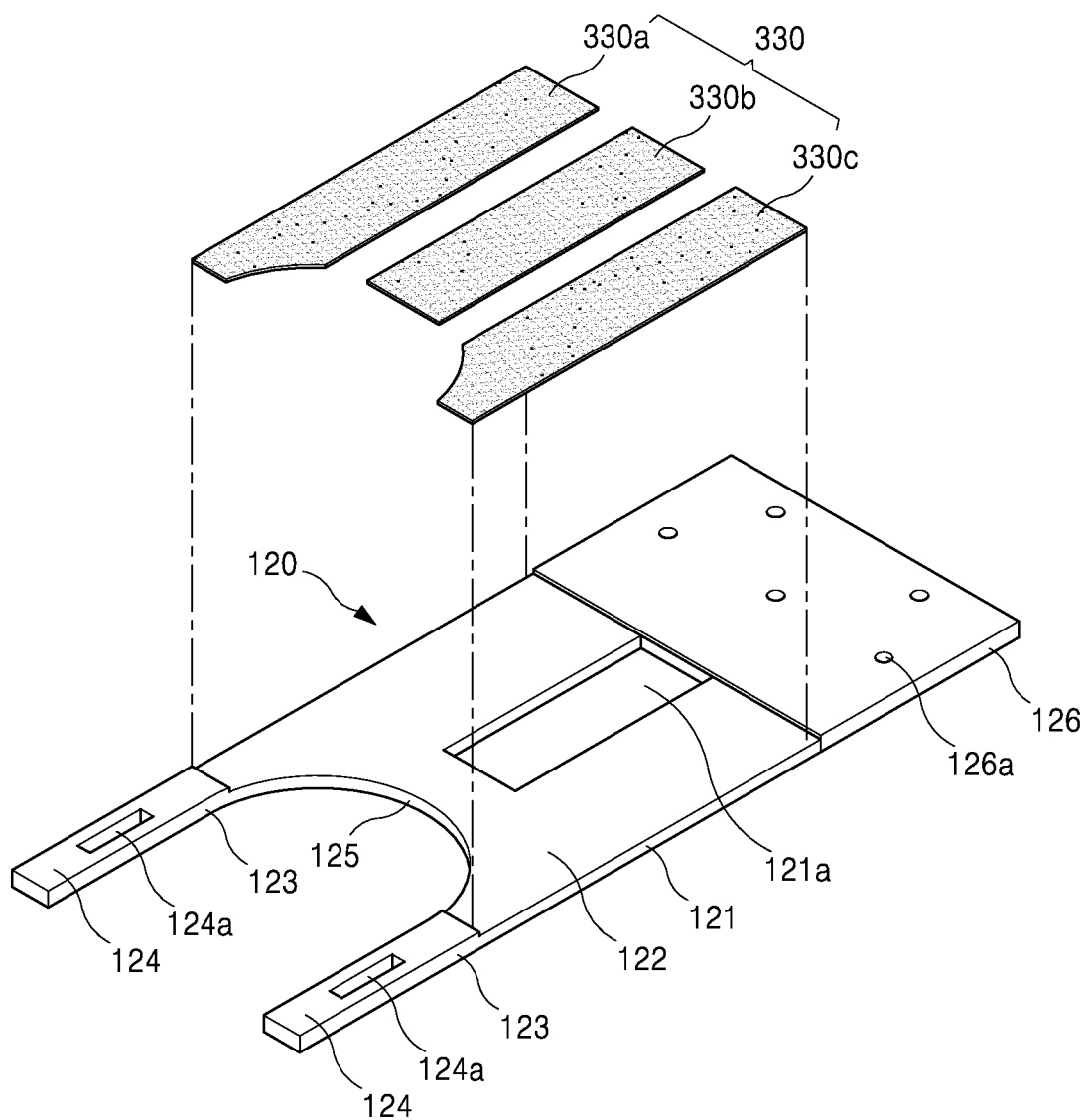
FIG. 8 is an exploded, schematic, perspective view illustrating structures of a wafer handling arm and a wafer heating module in an apparatus for testing a wafer according to an example embodiment of the present inventive concepts.

FIG. 8 is an exploded, schematic, perspective view illustrating structures of the wafer handling arm 120 and a wafer heating module 330 in an apparatus for testing a wafer according to another example embodiment of the present inventive concepts. Referring to FIG. 8, the wafer heating module 330 is not of an integrated type, as described in connection with FIGS. 1-5 and 7, but includes a plurality of unit modules 330a, 330b, and 330c, which may be coupled to or attached to the heating module installation surface 122 of the arm plate 121 at positions corresponding thereto.

When the structure of FIG. 8 is employed, the wafer may be preheated while transferring the wafer to the wafer chuck 110 for the wafer testing process so that generation of temperature hunting of the wafer chuck 110 may be reduced. Accordingly, temperature stabilization for the wafer testing process may be quickly achieved.

Figure 9:
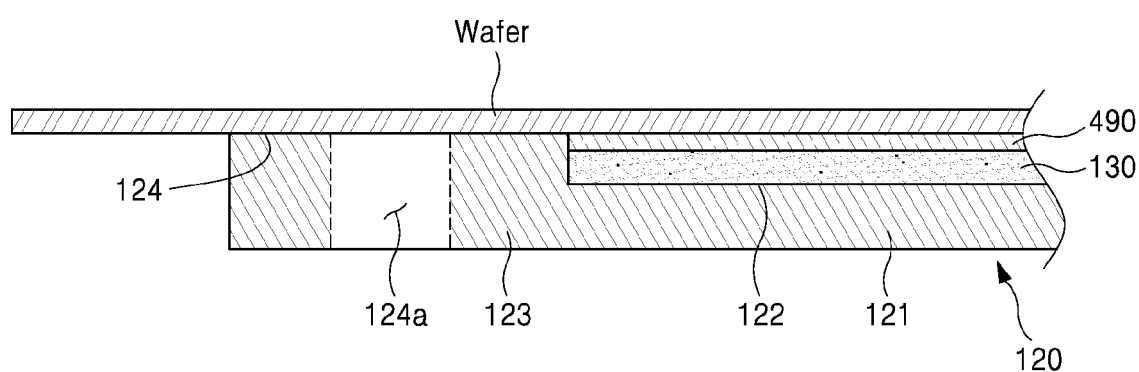
FIG. 9 is a schematic, perspective view illustrating a structure of an apparatus for testing a wafer according to an example embodiment of the present inventive concepts.

FIG. 9 is a schematic, perspective view illustrating a structure of an apparatus for testing a wafer according to another example embodiment of the present inventive concepts. Referring to FIG. 9, in the example embodiment of FIG. 9, while the wafer heating module 130 is coupled to or attached to the heating module installation surface 122 of the arm plate 121, a module cover 490 covering the wafer heating module 130 is further provided over the wafer heating module 130.

The module cover 490 may be coupled to the wafer handling arm 120 and shields the wafer heating module 130 from the outside. The module cover 490 may be formed of a ceramic material. That is, the module cover 490 is formed in the gap between the wafer heating module 130 and the wafer. When the module cover 490 is further provided as described in connection with FIG. 9, the wafer may contact the module cover 490 with out causing damage to the wafer and, thus, a stable wafer support force may be easily obtained.

When the structure of FIG. 9 is employed, the wafer may be preheated while transferring the wafer to the wafer chuck 110 for the wafer testing process so that generation of temperature hunting of the wafer chuck 110 may be reduced. Accordingly, temperature stabilization for the wafer testing process may be quickly achieved.

Figure 10:
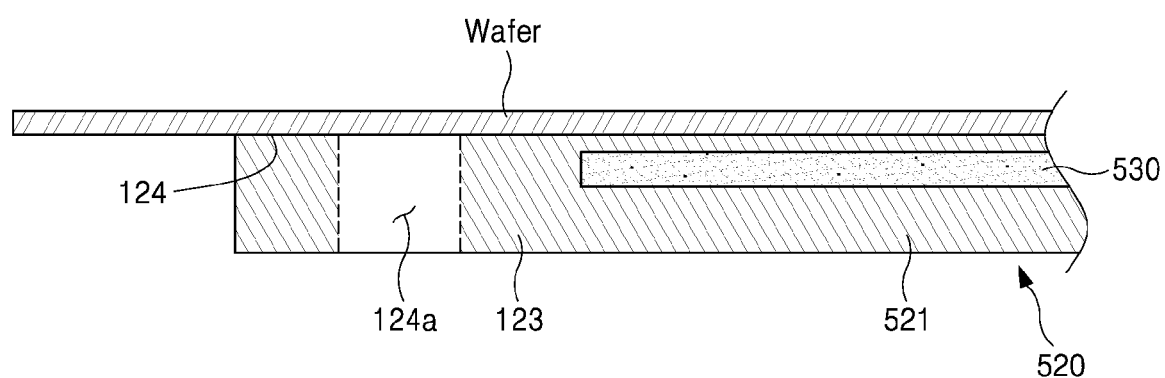
FIG. 10 is a schematic, perspective view illustrating a structure of an apparatus for testing a wafer according to an example embodiment of the present inventive concepts.

FIG. 10 is a schematic, perspective view illustrating a structure of an apparatus for testing a wafer according to another example embodiment of the present inventive concepts. In the above-described example embodiments, the wafer heating module 130 is exposed on the upper surface of the wafer handling arm 120. In the example embodiment of FIG. 10, however, a wafer heating module 530 is buried in a wafer handling arm 520, as illustrated in FIG. 10. That is, the wafer heating module 530 of a pad type is buried in an arm plate 521 such that the arm plate 521 surrounds the wafer heating module 530. According to this structure, the wafer contacts the upper surface of the arm plate 521 to be heated.

Since the structure of FIG. 10 enables supporting of the wafer throughout a large surface, the stable wafer support force may be easily obtained. As such, when the above structure is employed, the effect of the present inventive concepts may be provided. That is, when the structure of FIG. 10 is employed, the wafer may be preheated while transferring the wafer to the wafer chuck 110 for the wafer testing process so that generation of temperature hunting of the wafer chuck 110 may be reduced. Accordingly, temperature stabilization for the wafer testing process may be quickly achieved.

As described above, since the wafer is preheated and then loaded on the wafer chuck for a wafer testing process, generation of temperature hunting of the wafer chuck may be reduced. Also, temperature stabilization for the wafer testing process may be quickly achieved.

While the inventive concepts have been particularly shown and described with reference to example embodiments thereof, it will be understood that various changes in form and details may be made therein without departing from the spirit and scope of the following claims.

What is claimed is:

1. An apparatus for testing a wafer, the apparatus comprising:
   a wafer chuck on which the wafer is loaded to perform a wafer testing process;
   a wafer handling arm supporting the wafer and transferring the wafer to the wafer chuck;
   a wafer heating module coupled to the wafer handling arm and arranged parallel to the wafer, wherein the wafer heating module preheats the wafer to be loaded on the wafer chuck,
   a wafer temperature sensing unit sensing a temperature of the wafer that is supported and transferred by the wafer handling arm; and
   a module controller controlling a wafer heating temperature of the wafer heating module based on information provided by the wafer temperature sensing unit.

2. The apparatus of claim 1, wherein the wafer handling arm comprises:
   an arm plate having an upper surface comprising a heating module installation surface where the wafer heating module is installed; and
   a finger extending from one side of the arm plate forming a wafer support surface on which the wafer is supported.

3. The apparatus of claim 2, wherein the heating module installation surface is arranged to be lower than the wafer support surface.

4. The apparatus of claim 3, wherein an upper surface of the wafer heating module installed on the heating module installation surface is arranged to be lower than the wafer support surface.

5. The apparatus of claim 2, wherein the wafer heating module is a polyimide (PI) film heating pad having a plate shape and arranged parallel to the heating module installation surface, and the polyimide film heating pad is coupled to and attached to the heating module installation surface.

6. The apparatus of claim 5, wherein the wafer heating module is arranged in an entire area of the heating module installation surface.

7. The apparatus of claim 2, wherein a through hole for passing an electric wire that is connected to the wafer heating module is formed in the arm plate.

8. The apparatus of claim 2, wherein the finger comprises a pair of fingers and a cut portion having an arc shape is formed at one side of the arm plate between the pair of fingers.

9. The apparatus of claim 2, wherein the wafer handling arm comprises an arm support that is connected to the arm plate at a position opposite to the finger and supports the arm plate.

10. The apparatus of claim 9, wherein a plurality of coupling holes are formed in the arm support, and the arm support is arranged to be higher than the upper surface of the arm plate.

11. The apparatus of claim 1, further comprising a chuck controller controlling a temperature of the wafer chuck, wherein the module controller controls a wafer heating temperature of the wafer heating module according to an interaction with the chuck controller.

12. The apparatus of claim 11, further comprising an error message display unit externally displaying error messages of the chuck controller and the module controller.

13. The apparatus of claim 1, further comprising a module cover coupled to the wafer handling arm and covering the wafer heating module.

14. The apparatus of claim 1, wherein the wafer heating module is exposed on an upper surface of the wafer handling arm or is buried in the wafer handling arm.

* * * * *